(12) United States Patent
Guo et al.

(10) Patent No.: US 12,069,931 B2
(45) Date of Patent: Aug. 20, 2024

(54) ORGANIC LIGHT-EMITTING DIODE DEVICE WITH AN ARRAY SUBSTRATE AND MANUFACTURING METHOD THEREOF

(71) Applicant: Wuhan China Star Optoelectronics Semiconductor Display Technology Co., Ltd., Hubei (CN)

(72) Inventors: Tianfu Guo, Hubei (CN); Hsianglun Hsu, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 849 days.

(21) Appl. No.: 17/051,449

(22) PCT Filed: Mar. 18, 2020

(86) PCT No.: PCT/CN2020/080009
§ 371 (c)(1),
(2) Date: Oct. 29, 2020

(87) PCT Pub. No.: WO2021/134923
PCT Pub. Date: Jul. 8, 2021

(65) Prior Publication Data
US 2023/0165115 A1    May 25, 2023

(30) Foreign Application Priority Data

Dec. 30, 2019   (CN) .......................... 201911390796.5

(51) Int. Cl.
*H10K 59/80*    (2023.01)
*H10K 59/12*    (2023.01)
(Continued)

(52) U.S. Cl.
CPC ....... *H10K 59/873* (2023.02); *H10K 59/1201* (2023.02); *H10K 71/164* (2023.02)

(58) Field of Classification Search
CPC ............. H10K 59/873; H10K 59/8731; H10K 59/124; H10K 59/1201; H10K 71/164;
(Continued)

(56) References Cited

U.S. PATENT DOCUMENTS

| 9,281,346 B1 | 3/2016 | Lim et al. |
| 2003/0219928 A1 | 11/2003 | Kato et al. |

(Continued)

FOREIGN PATENT DOCUMENTS

| CN | 101548372 | 9/2009 |
| CN | 103943786 | 7/2014 |

(Continued)

*Primary Examiner* — Didarul A Mazumder

(57) ABSTRACT

An organic light-emitting diode device and a manufacturing method thereof are provided. The organic light-emitting diode device includes an array substrate, a light-emitting layer and a thin-film encapsulation layer stacked in order from bottom to top. The thin-film encapsulation layer includes a first inorganic layer, an organic layer and at least one dielectric structure layer in a stack. There is the dielectric structure layer is disposed in the thin-film encapsulation layer.

7 Claims, 8 Drawing Sheets

(51) Int. Cl.
*H10K 59/121* (2023.01)
*H10K 71/16* (2023.01)

(58) Field of Classification Search
CPC ............ H10K 50/844; H10K 50/8445; H10K 59/123; H10K 59/1213
USPC ...................................... 257/40; 438/82, 99
See application file for complete search history.

(56) References Cited

U.S. PATENT DOCUMENTS

| | | |
|---|---|---|
| 2010/0025681 A1 | 2/2010 | Katoh et al. |
| 2010/0084642 A1* | 4/2010 | Hanari ................... H10K 59/13 257/40 |
| 2014/0070195 A1* | 3/2014 | Choi ....................... H10K 50/84 438/26 |
| 2015/0137131 A1* | 5/2015 | Kim ................... H10K 50/8445 438/28 |
| 2017/0278452 A1 | 9/2017 | Oh et al. |
| 2020/0194363 A1 | 6/2020 | Chen et al. |

FOREIGN PATENT DOCUMENTS

| | | |
|---|---|---|
| CN | 105762153 | 7/2016 |
| CN | 107229165 | 10/2017 |
| CN | 107564923 | 1/2018 |
| CN | 110148684 | 8/2019 |
| CN | 110518146 | 11/2019 |
| CN | 110571347 | 12/2019 |
| JP | 2007-141685 | 6/2007 |

* cited by examiner

ORGANIC LIGHT-EMITTING DIODE DEVICE WITH AN ARRAY SUBSTRATE AND MANUFACTURING METHOD THEREOF

RELATED APPLICATIONS

This application is a National Phase of PCT Patent Application No. PCT/CN2020/080009 having International filing date of Mar. 18, 2020, which claims the benefit of priority of Chinese Patent Application No. 201911390796.5 filed on Dec. 30, 2019. The contents of the above applications are all incorporated by reference as if fully set forth herein in their entirety.

FIELD AND BACKGROUND OF THE INVENTION

The present disclosure relates to a field of display technology, and more particularly, to an organic light-emitting diode device and a manufacturing method.

Organic light-emitting diodes (OLEDs) have advantages of light weight, wide viewing angles, fast response times, low temperature resistance, high luminous efficiency, and so on, compared with traditional liquid crystal display panels. The OLEDs have been regarded as a next generation of new display technology in a display industry. Particularly, that the OLEDs can be made into flexible devices which can be bent by using flexible substrates is a huge advantage unique to the OLEDs. Thin-film encapsulation (TFE) technology is an essential core technology to realize the OLEDs' advantage in flexible displays.

A fatal killer of the OLEDs is an existence of external water and oxygen in an environment. Invasion pathways of the external water and oxygen can be divided into two categories: a first invasion pathway is that the external water and oxygen penetrates a TFE film layer from top to bottom into a display panel; a second invasion pathway is that the external water and oxygen invades into the OLED from a side of the TFE film layer. Therefore, for the TFE technology, a most important thing is a property to effectively block the external water and oxygen. On this basis, optical penetration and flexible bending properties of the TFE film layer should also be taken in account.

As shown in FIG. 1, a common display panel includes a glass base 91, an array substrate 92, a light-emitting layer 93, and a thin-film encapsulation layer 94, wherein the thin-film encapsulation layer 94 includes a first inorganic layer 941, an organic layer 942, and a second inorganic layer 943, which are disposed as a sandwich film structure and is a common TFE film layer structure in the industry. A water vapor transmission rate (WVTR) of the sandwich film structure can be less than 5 E-4 g/m2/day in the industry. Blocking the external water and oxygen from penetrating into the display panel is mainly accomplished via the first inorganic layer and the second inorganic layer, but with the addition of the organic layer to realize a flexible bending property and other properties, a film of the organic layer being loose and porous and does not have any ability to block the external water and oxygen, therefore, the display panel has a poor external water and oxygen blocking effect.

In a prior art, an aluminum oxide layer and a polypropylene (PP) layer are used to form a laminated film layer in the thin-film encapsulation structure. This laminated film layer has a good external water and oxygen blocking property in theory, but in a real manufacturing process it cannot effectively wrap unavoidable foreign objects. So that actual external water and oxygen blocking effect tends to be worse.

In a prior art, a structure of the thin-film encapsulation layer specifically includes a first inorganic layer, a first organic layer, a second inorganic layer, a second organic layer, and a third inorganic layer, wherein the first inorganic layer is made of aluminum oxide. The structure of the thin-film encapsulation layer has a main disadvantage is that such an overlapping design structure of inorganic layers and organic layers is too thick, resulting in a relatively poor bending ability. The thin-film encapsulation layer tends to be excessively stressed, and may even cause a light-emitting film layer under the display panel to separate, going against a long-term development of a flexible display panel.

SUMMARY OF THE INVENTION

The present disclosure provides an organic light-emitting diode device and a manufacturing method thereof to further improve an external water and oxygen blocking property of a thin-film encapsulation layer.

To solve the problem above, the present disclosure provides an organic light-emitting diode device including an array substrate, a light-emitting layer and a thin-film encapsulation layer stacked in order from bottom to top. The thin-film encapsulation layer is disposed on the light-emitting layer and is completely covering the light-emitting layer. Wherein the thin-film encapsulation layer includes a first inorganic layer, an organic layer, a second inorganic layer, and at least one dielectric structure layer. Specifically, the first inorganic layer is disposed on the light-emitting layer. The organic layer is disposed on the first inorganic layer. The second inorganic layer is disposed on the organic layer. The dielectric structure layers are disposed in the thin-film encapsulation layer.

Further, the dielectric structure layers are disposed between the organic layer and the first inorganic layer, or the dielectric structure layers are disposed between the organic layer and the second inorganic layer, or the dielectric structure layers are disposed in the organic layer.

Further, the dielectric structure layers are disposed between the organic layer and the first inorganic layer, and the dielectric structure layers are disposed between the organic layer and the second inorganic layer.

Further, the dielectric structure layers are disposed between the organic layer and the first inorganic layer, and the dielectric structures are disposed in the organic layer.

Further, the dielectric structure layers are disposed between the organic layer and the second inorganic layer, and the dielectric structure layers are disposed in the organic layer.

Further, the dielectric structure layers are disposed between the organic layer and the first inorganic layer, and the dielectric structure layers are disposed between the organic layer and the second inorganic layer, and the dielectric structure layers are disposed in the organic layer.

Further, the dielectric structure layers are manufactured by an atomic layer deposition method.

The present disclosure also provides a manufacturing method of an organic light-emitting diode device, including steps of: a step of providing an array substrate; a step of disposing a light-emitting layer on the substrate; and a step of disposing a thin-film encapsulation layer on the light-emitting layer; wherein the step of disposing a thin-film encapsulation layer on the light-emitting layer includes steps of: a step of disposing a first inorganic layer on the light-emitting layer; a step of disposing an organic layer on the first inorganic layer; and a step of disposing a second inorganic layer on the organic layer; wherein the step of disposing the thin-film encapsulation layer on the light-emitting layer further includes: a step of disposing at least one dielectric structure layer in the thin-film encapsulation layer by an atomic layer deposition method.

Further, the step of disposing at least one dielectric structure layer in the thin-film encapsulation layer by the atomic layer deposition method includes depositing one or more of silicon nitride (SiN), silicon oxynitride (SiON), silicon carbonitride (SiNC), and silicon oxide (SiO) in a stack combination by the atomic layer deposition method.

Further, the step of disposing at least one dielectric structure layer in the thin-film encapsulation layer by an atomic layer deposition method includes: a step of disposing a first organic layer on the first inorganic layer; a step of disposing the dielectric structure layer on the first organic layer; and a step of disposing the second organic layer on the dielectric structure layer; wherein the step of disposing the dielectric structure layer on the first organic layer and the step of disposing the second organic layer on the dielectric structure layer are performed at least once.

Advantages of the present disclosure is to provide the organic light-emitting diode device and a manufacturing method thereof. Defects of the organic layer can be covered very well, and the external water and oxygen blocking property of the thin-film encapsulation layer can be further improved by depositing at least one very thin and dense dielectric structure layer in the thin-film encapsulation layer.

Figure 1:
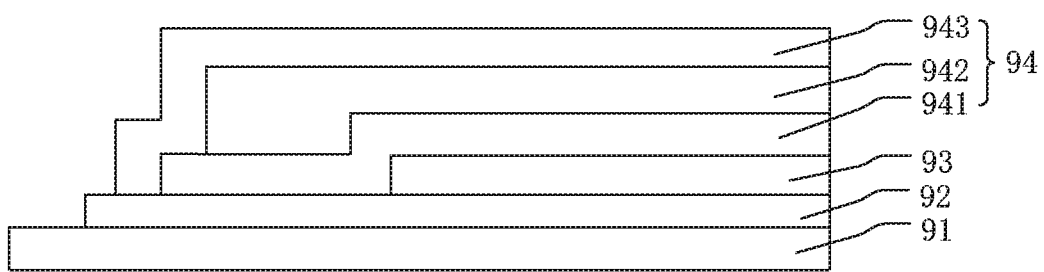
FIG. 1 is a schematic structural diagram of a present display panel.

Some major elements in the drawings are as follows:

1, array substrate; 2, light-emitting layer; 3, thin-film encapsulation layer; 20, thin-film transistor; 21, first organic common layer; 22, electroluminescent layer; 23, second organic common layer; 30, dielectric structure layer; 31, first inorganic layer; 32, organic layer; 33, second inorganic layer; 100, organic light-emitting diode device; 101, glass base; 102, flexible base; 103, buffer layer; 104, pixel definition layer; 201, active layer; 202, gate insulating layer; 203, gate layer; 204, insulating layer; 205, source and drain electrode; 206, planarization layer; 207, anode; 321, first organic layer; 322, second organic layer.

DESCRIPTION OF SPECIFIC EMBODIMENTS OF THE INVENTION

In the present invention, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed there between. Furthermore, a first feature "on", "above" or "on top of" a second feature may include an embodiment in which the first feature is right or obliquely "on", "above" or "on top of" the second feature, or just means that the first feature is at a height higher than that of the second feature; while a first feature "below", "under" or "on bottom of" a second feature may include an embodiment in which the first feature is right or obliquely "below", "under" or "on bottom of" the second feature, or just means that the first feature is at a height lower than that of the second feature.

Same or corresponding components are denoted by the same reference numerals and are not related to the numbers of the figures. In the full text of the description, when the terms "first" and "second" are used to describe various components, these components are not necessarily limited to the above terms. The above terms are used only to distinguish one component from another.

A First Embodiment

Figure 2:
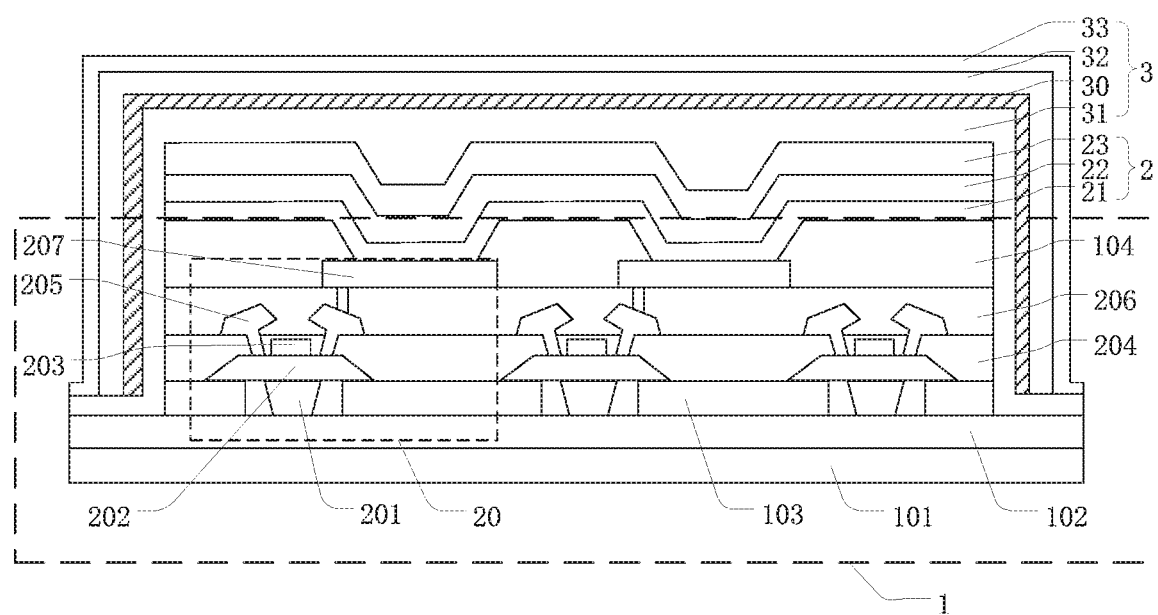
FIG. 2 is a schematic structural diagram of an organic light-emitting diode device according to a first embodiment.

Please refer to FIG. 2, an embodiment of the present disclosure provides an organic light-emitting diode device 100 including an array substrate 1, a light-emitting layer 2, and a thin-film encapsulation layer 3 stacked from bottom to top. Wherein the light-emitting layer 2 is disposed on the array substrate 1, and the thin-film encapsulation layer 3 is disposed on the light-emitting layer 2 and completely covers the light-emitting layer 2.

The array substrate 1 is preferably a flexible substrate, and includes a glass base 101, a flexible base 102, a buffer layer 103, a plurality of thin-film transistors 20, and a pixel definition layer 104.

The glass base 101 is a glass base in the prior art. Material of the flexible base 102 is mainly polyimide (PI) which can effectively improve a light transmittance. Each of the plurality of thin-film transistors 20 includes an active layer 201, a gate insulating layer 202, a gate layer 203, an insulating layer 204, a source and drain electrode 205, a planarization layer 206, and an anode 207. Specifically, doped regions are disposed at both ends of the active layer 201, and the doped regions can be doped with P-type impurities or N-type impurities to form a connection region of a source and drain electrode of a metal oxide semiconductor (MOS) tube, and to connect to the source and drain electrode 205. The gate insulating layer 202 is configured to insulate the source and drain electrode 205 and the gate layer 203 to avoid a contact between two electrodes which makes a short circuit. The insulating layer 204 is disposed on upper surfaces of the gate insulating layer 202 and the gate layer 203 and is penetrated by the source and drain electrode 205. The planarization layer 206 is disposed on upper surfaces of the source and drain electrode 205 and the insulating layer 204. The anode 207 is disposed on upper surfaces of the planarization layer 206 and is electrically connected to a drain electrode of the source and drain electrode 205. The planarization layer 206 is generally made of polymethyl methacrylate and nanoparticle composites and has a better heat resistance. The pixel definition layer 104 is disposed on the upper surfaces of planarization layer 206 and the anode 207. The light-emitting layer 2 is disposed on an upper surface of the pixel definition layer 104.

The light-emitting layer 2 includes a first organic common layer 21, an electroluminescent layer 22, and a second organic common layer 23 in a stack. The electroluminescent layer 22 specifically includes a hole injection layer (HIL), a hole transport layer (HTL), an organic emitting layer (EML), an electron transport layer (ETL), and an electron injection layer (EIL).

As shown in FIG. 2, the thin-film encapsulation layer 3 includes a first inorganic layer 31, an organic layer 32, a second inorganic layer 33, and at least one dielectric structure layer 30 in a stack. Specifically, the first inorganic layer 31 is disposed on the light-emitting layer 2. The organic layer 32 is disposed on the first inorganic layer 31. The second inorganic layer 33 is disposed on the organic layer 32. The dielectric structure layer 30 is disposed in the thin-film encapsulation layer 3. According to embodiment, the dielectric structure layer 30 is disposed between the organic layer 32 and the first inorganic layer 31.

External water and oxygen can easily invade into the organic light-emitting diode device 100 from the first inorganic layer 31 or the second inorganic layer 33, since a film of the organic layer 32 is loose and porous, and does not have any ability to block external water and oxygen. Therefore, disposing the dielectric structure layer 30 between the first inorganic layer 31 and the organic layer 32 can prevent the external water and oxygen from passing through the organic layer 32 and continue intruding into the organic light-emitting diode device 100. Therefore, an external water and oxygen barrier property can be improved, and a performance of the thin-film encapsulation layer can be improved.

According to the embodiment, a material of the dielectric structure layer 30 is one or more of silicon nitride (SiN), silicon oxynitride (SiON), silicon carbo nitride (SiNC), and silicon oxide (SiO) in a stack combination. According to the embodiment, the dielectric structure layer 30 is made by an atomic layer deposition method. According to the embodiment, a thickness of the dielectric structure layer 30 is less than 200 nanometer (nm).

Figure 3:
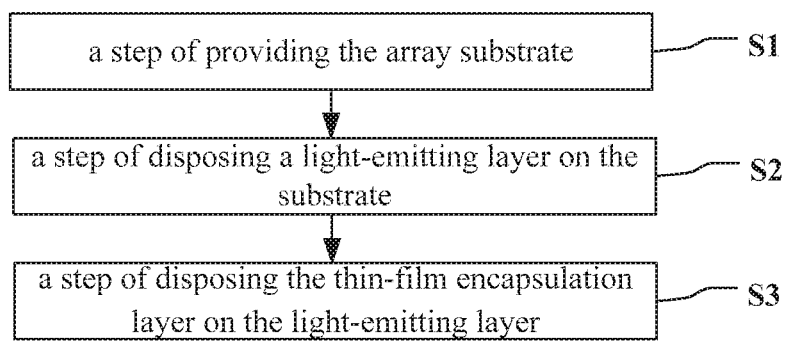
FIG. 3 is a schematic structural diagram of a manufacturing method of an organic light-emitting diode device according to a first embodiment.

Please refer to FIG. 2 and FIG. 3, an embodiment of the present disclosure also provides a manufacturing method of the organic light-emitting diode device 100 including steps of:

S1, a step of providing the array substrate 1.

S2, a step of disposing a light-emitting layer 2 on the substrate 1. The light-emitting layer 2 specifically includes the first organic common layer 21, the electroluminescent layer 22, and the second organic common layer 23 in a stack. The electroluminescent layer 22 specifically includes the hole injection layer (HIL), the hole transport layer (HTL), the organic emitting layer (EML), the electron transport layer (ETL), and the electron injection layer (EIL) stacked in order from bottom to top.

S3, a step of disposing the thin-film encapsulation layer 3 on the light-emitting layer 2.

Figure 4:
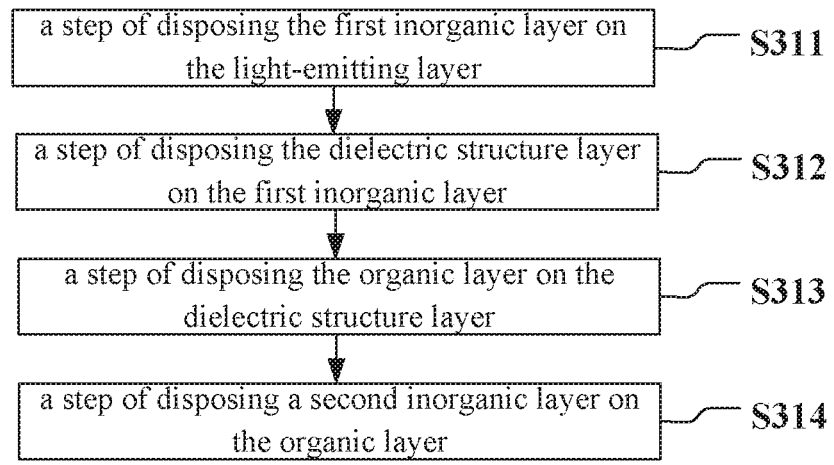
FIG. 4 is a schematic structural diagram of a manufacturing step of a thin-film encapsulation layer according to a first embodiment.

Please refer to FIG. 4, the step of disposing the thin-film encapsulation layer 3 on the light-emitting layer 2 includes following steps of S311-S314:

S311, a step of disposing the first inorganic layer 31 on the light-emitting layer 2. The first inorganic layer 31 is made of a layer of inorganic material having a thickness of less than 2 um deposited on the light-emitting layer 2 by a chemical vapor deposition (CVD) or a physical vapor deposition (PVD). The inorganic material includes silicon nitride (SiN), silicon oxynitride (SiON), silicon carbonitride (SiNC), or silicon oxide (SiO).

S312, a step of disposing the dielectric structure layer 30 on the first inorganic layer 31.

S313, a step of disposing the organic layer 32 on the dielectric structure layer 30. The organic layer 32 is made of a layer of organic material deposited on the dielectric structure layer 30 by an inkjet printing (IJP), a chemical vapor deposition (CVD) or an evaporation. The organic material includes Hexamethyldisiloxane (HMDSO), alucone, epoxy resin, acrylic, or silicon-containing organic matter.

S314, a step of disposing a second inorganic layer 33 on the organic layer 32. The second inorganic layer 33 is made of a layer of inorganic material having a thickness of less than 2 um deposited on the light-emitting layer 2 by a chemical vapor deposition (CVD) or a physical vapor deposition (PVD). The inorganic material includes silicon nitride (SiN), silicon oxynitride (SiON), silicon carbonitride (SiNC), or silicon oxide (SiO).

Wherein the step of disposing the dielectric structure layer 30 on the first inorganic layer 31 includes depositing one or more of silicon nitride (SiN), silicon oxynitride (SiON), silicon carbonitride (SiNC), and silicon oxide (SiO) in a stack combination by the atomic layer deposition method.

Figure 5:
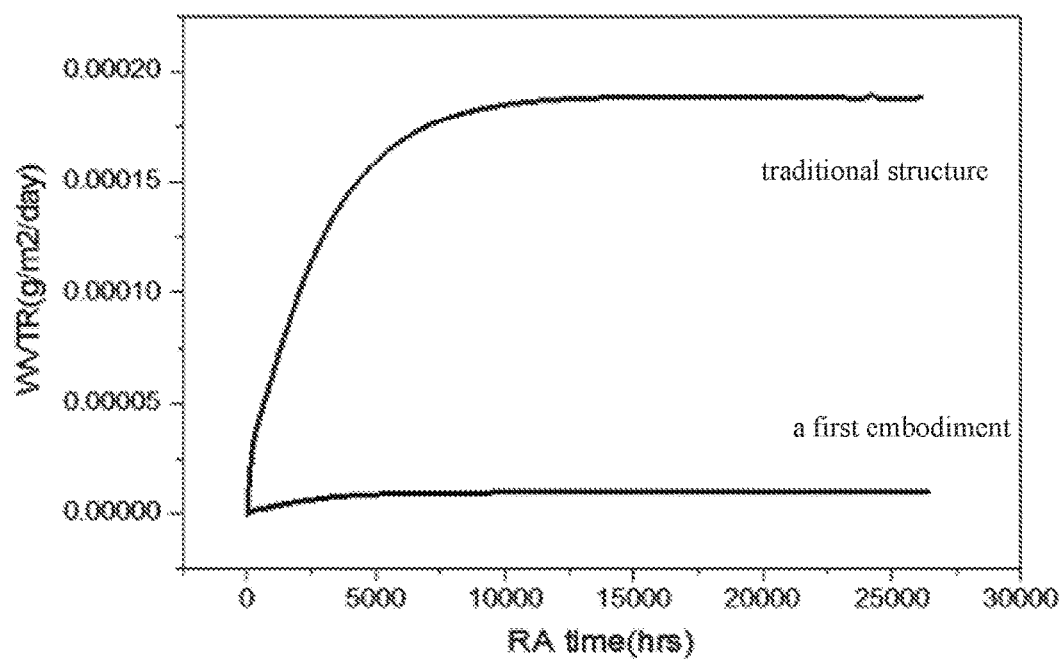
FIG. 5 is a comparison result of a water vapor transmission rate of an organic light-emitting diode device according to a first embodiment and a traditional organic light-emitting diode device having a sandwich TFE film layer structure.

Please refer to FIG. 5, FIG. 5 is a comparison result of a water vapor transmission rate (WVTR) of the organic light-emitting diode device 100 according to the first embodiment of the present disclosure and a traditional organic light-emitting diode device having a sandwich TFE film layer structure. It can be seen that the WVTR is significantly improved and an effect of blocking external water and oxygen is possessed after the dielectric structure layer 30 is disposed.

A Second Embodiment

Figure 6:
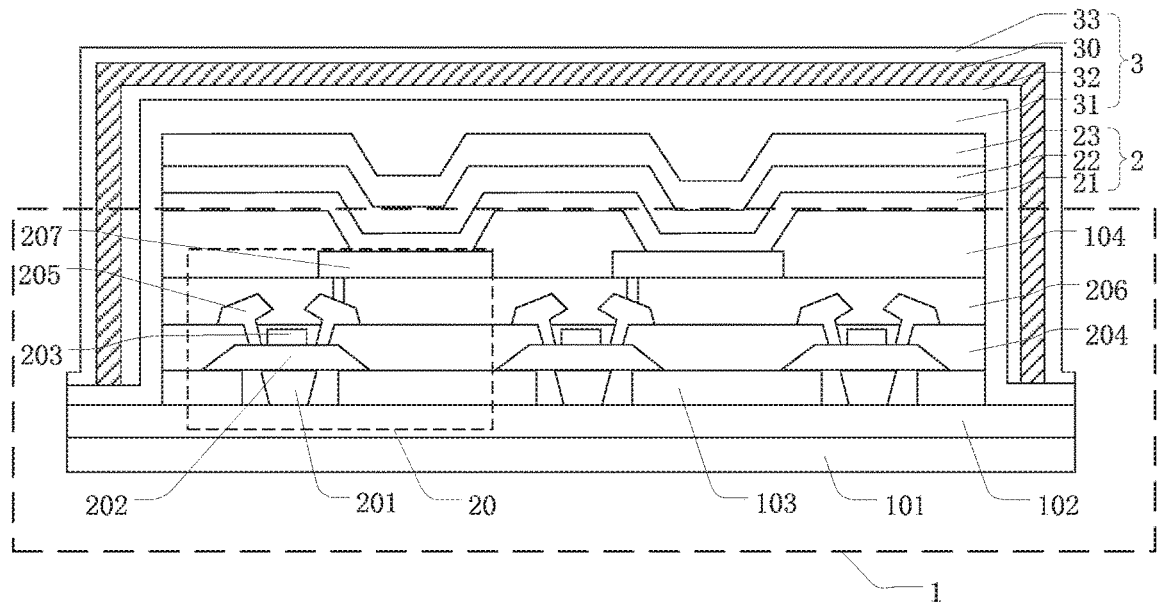
FIG. 6 is a schematic structural diagram of an organic light-emitting diode device according to a second embodiment.

Please refer to FIG. 6, the organic light-emitting diode device including most of technical features in the first embodiment is provided according to the embodiment of the present disclosure. A difference is that that the dielectric structure layer 30 is disposed between the organic layer 32 and the second inorganic layer 33, instead of the dielectric structure layer 30 being only disposed between the organic layer 32 and the first inorganic layer 31.

As shown in FIG. 6, the thin-film encapsulation layer 3 of the organic light-emitting diode device 100 includes the first inorganic layer 31, the organic layer 32, the dielectric structure layer 30, and the second inorganic layer 33 from bottom to top.

Since the film of the organic layer 32 is loose and porous and does not have any ability to block external water and oxygen, the dielectric structure layer 30 disposed between the organic layer 32 and the second inorganic layer 33 can enhance a density of the organic layer 32, thereby improving the external water and oxygen barrier property of the organic layer 32, and improving the external water and oxygen barrier property of the thin-film encapsulation layer 3.

Please refer to FIG. 3, a manufacturing method of the organic light-emitting diode device is also provided according to the embodiment of the present disclosure, and includes following steps S1-S3: S1, a step of providing the array substrate 1. S2, a step of disposing the light-emitting layer 2 on the substrate 1. S3, a step of disposing the thin-film encapsulation layer 3 on the light-emitting layer 2.

Figure 7:
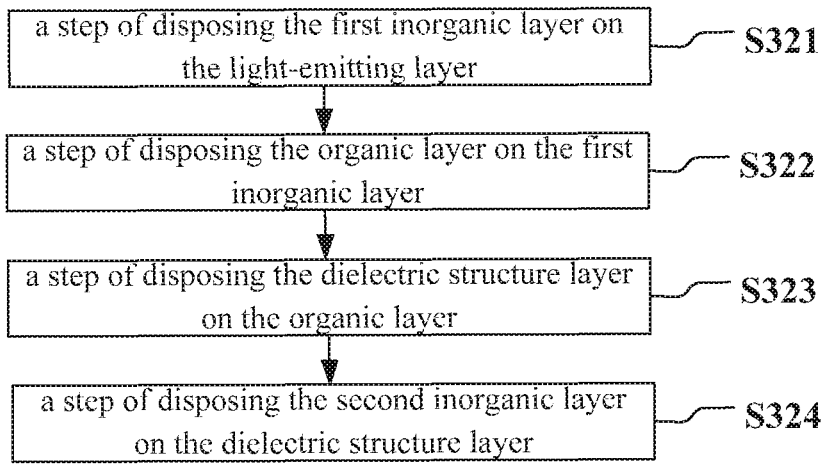
FIG. 7 is a schematic diagram of a manufacturing method of an organic light-emitting diode device according to a second embodiment.

Please refer to FIG. 6 and FIG. 7 at the same time, the step of disposing the thin-film encapsulation layer 3 on the light-emitting layer 2 includes following steps S321-S324:

S321, a step of disposing the first inorganic layer 31 on the light-emitting layer 2. The first inorganic layer 31 is made of a layer of inorganic material having a thickness of less than 2 um deposited on the light-emitting layer 2 by a chemical vapor deposition (CVD) or a physical vapor deposition (PVD). The inorganic material includes silicon nitride (SiN), silicon oxynitride (SiON), silicon carbonitride (SiNC), or silicon oxide (SiO).

S322, a step of disposing the organic layer 32 on the first inorganic layer 31.

The organic layer 32 is made of a layer of organic material deposited on the dielectric structure layer 30 by an inkjet printing (IJP), a chemical vapor deposition (CVD) or an evaporation. The organic material includes Hexamethyldisiloxane (HMDSO), alucone, epoxy resin, acrylic, or silicon-containing organic matter.

S323, a step of disposing the dielectric structure layer 30 on the organic layer 32.

S324, a step of disposing the second inorganic layer 33 on the dielectric structure layer 30. The second inorganic layer 33 is made of a layer of inorganic material having a thickness of less than 2 um deposited on the light-emitting layer 2 by a chemical vapor deposition (CVD) or a physical vapor deposition (PVD). The inorganic material includes silicon nitride (SiN), silicon oxynitride (SiON), silicon carbonitride (SiNC), or silicon oxide (SiO).

A difference between the steps S311-S314 according to the first embodiment and the steps S321-S24 is the manufacturing method of the display panel according to the second embodiment. The step of disposing the dielectric structure layer 30 on the organic layer 32 is performed after the step of disposing the organic layer 32 on the first inorganic layer 31. That is, the dielectric structure layer 30 is only disposed between the organic layer 32 and the first inorganic layer 31.

Defects of the organic layer 32 can be covered very well according to the embodiment, and the external water and oxygen blocking property of the thin-film encapsulation layer 3 can be further improved.

A Third Embodiment

A display panel including most of technical features in the first embodiment or the second embodiment is provided according to the embodiment of the disclosure. A difference is that that the dielectric structure layer 30 is also disposed in the organic layer 32 according to the second embodiment.

Figure 8:
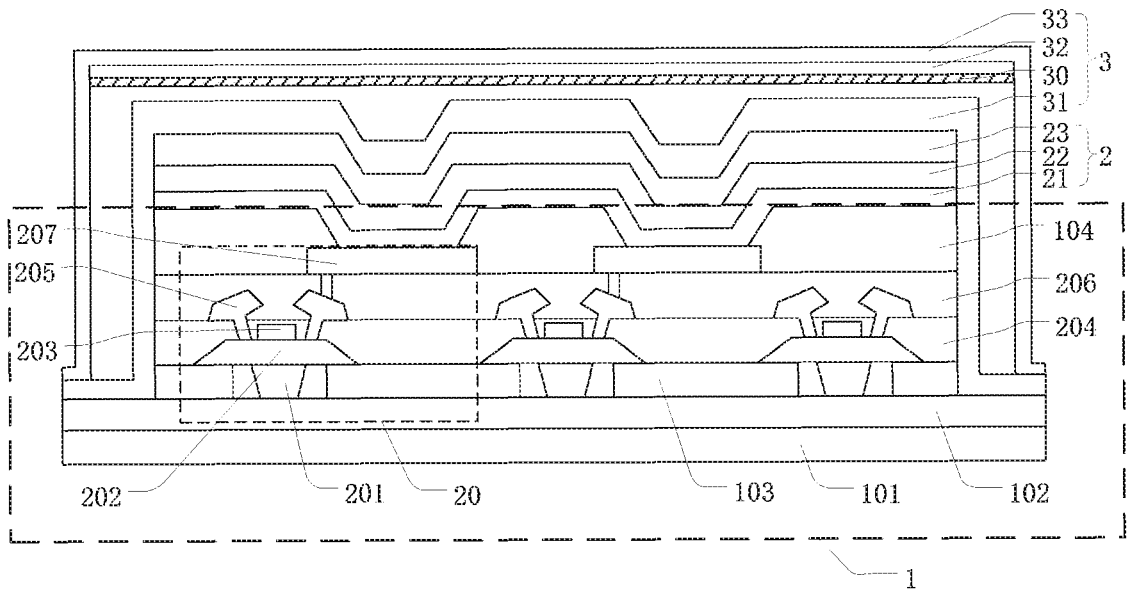
FIG. 8 is a schematic structural diagram of an organic layer according to a third embodiment.

As shown in FIG. 8, the organic layer 32 includes the first organic layer 321 and the second organic layer 322, and the dielectric structure layer 30 is disposed between the first organic layer 321 and the second organic layer 322.

Since the film of the organic layer 32 is loose and porous and does not have any ability to block the external water and oxygen, the dielectric structure layer 30 is disposed in the organic layer 32 can enhance a density and the external water and oxygen barrier property of the organic layer 32, thereby improving the external water and oxygen barrier property of the thin-film encapsulation layer 3.

A manufacturing method of the organic light-emitting diode device 100 is also provided according to the embodiment of the present disclosure, and includes following steps S1-S3: S1, a step of providing the array substrate 1. S2, a step of disposing the light-emitting layer 2 on the substrate 1. S3, a step of disposing the thin-film encapsulation layer 3 on the light-emitting layer 2.

Figure 9:
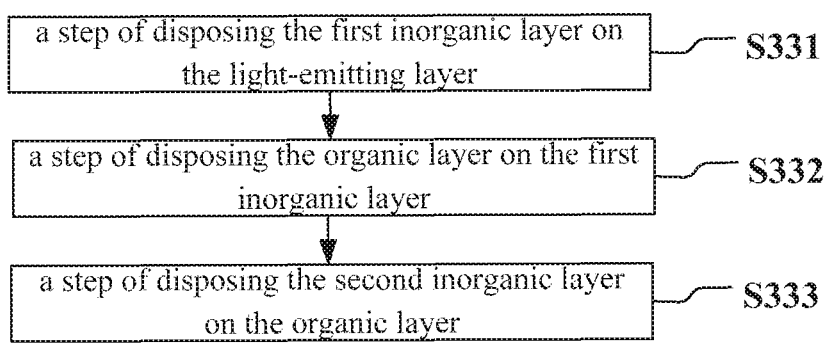
FIG. 9 is a schematic diagram of a manufacturing step of a thin-film encapsulation layer according to a third embodiment.

Please refer to FIG. 8 and FIG. 9 at the same time, the step S3 of disposing the thin-film encapsulation layer 3 on the light-emitting layer 2 includes following steps S331-S333:

S331, a step of disposing the first inorganic layer 31 on the light-emitting layer 2. The first inorganic layer 31 is made of a layer of inorganic material having a thickness of less than 2 um deposited on the light-emitting layer 2 by a chemical vapor deposition (CVD) or a physical vapor deposition (PVD). The inorganic material includes silicon nitride (SiN), silicon oxynitride (SiON), silicon carbonitride (SiNC), or silicon oxide (SiO).

S332, a step of disposing the organic layer 32 on the first inorganic layer 31.

S333, a step of disposing the second inorganic layer 33 on the organic layer 32. The second inorganic layer 33 is made of a layer of inorganic material having a thickness of less than 2 um deposited on the light-emitting layer 2 by a chemical vapor deposition (CVD) or a physical vapor deposition (PVD). The inorganic material includes silicon nitride (SiN), silicon oxynitride (SiON), silicon carbonitride (SiNC), or silicon oxide (SiO).

According to the embodiment, the step of disposing the organic layer 32 on the first inorganic layer 31 includes: disposing at least one dielectric structure layer 30 in the organic layer 32. That the dielectric structure layer 30 is disposed in the organic layer 32 can enhance a density and the external water and oxygen barrier property of the organic layer 32, thereby improving the external water and oxygen barrier property of the thin-film encapsulation layer 3.

Figure 10:
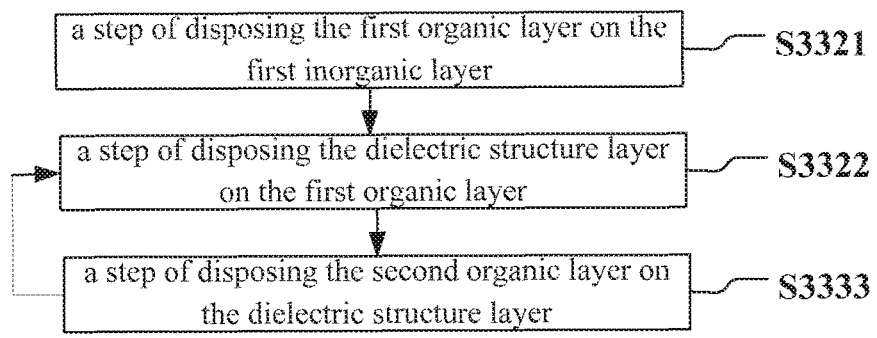
FIG. 10 is a schematic diagram of a step of manufacturing at least one dielectric structure layer according to a third embodiment.

Please refer to FIG. 10, the step S322 of disposing at least one dielectric structure layer 30 in the organic layer 32 includes:

S3321, a step of disposing the first organic layer 321 on the first inorganic layer 31. The first organic layer 321 is made of a layer of organic material by an inkjet printing (IJP), a chemical vapor deposition (CVD) or an evaporation. The organic material includes Hexamethyldisiloxane (HMDSO), alucone, epoxy resin, acrylic, or silicon-containing organic matter.

S3322, a step of disposing the dielectric structure layer 30 on the first organic layer 321. The dielectric structure layer 30 is made of a layer of inorganic material having a thickness of less than 2 um deposited on the light-emitting layer 2 by a chemical vapor deposition (CVD) or a physical vapor deposition (PVD). The inorganic material includes silicon nitride (SiN), silicon oxynitride (SiON), silicon carbonitride (SiNC), or silicon oxide (SiO). Material of the dielectric structure layer 30 is one or more of silicon nitride (SiN), silicon oxynitride (SiON), silicon carbonitride (SiNC), and silicon oxide (SiO) in a stack combination.

S3323, a step of disposing the second organic layer 322 on the dielectric structure layer 30. The second organic layer 322 is made of a layer of organic material by an inkjet printing (IJP), a chemical vapor deposition (CVD) or an evaporation. The organic material includes Hexamethyldisiloxane (HMDSO), alucone, epoxy resin, acrylic, or silicon-containing organic matter.

Wherein the step S3322 of disposing the dielectric structure layer 30 on the first organic layer 321 and the step S3323 of disposing the second organic layer 322 are performed at least once.

A Fourth Embodiment

Figure 11:
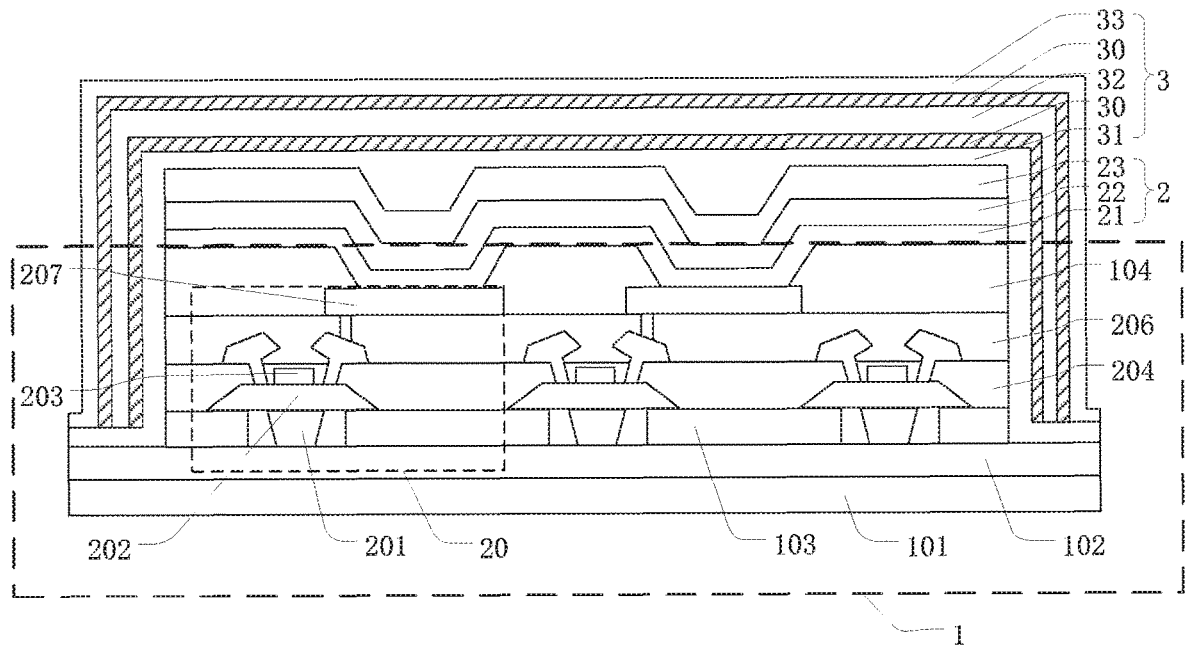
FIG. 11 is a schematic structural diagram of an organic light-emitting diode device according to a fourth embodiment.

As shown in FIG. 11, a display panel including 100 all technical features in the first embodiment and the second embodiment is provided according to the embodiment of the disclosure. A difference is that that the fourth embodiment is a combination of the first embodiment and the second embodiment. That is, the dielectric structure layer 30 is disposed between the organic layer 32 and the first inorganic layer 31 and is disposed between the organic layer 32 and the second inorganic layer 33.

As shown in FIG. 11, the thin-film encapsulation layer 3 of the organic light-emitting diode device 100 includes the first inorganic layer 31, the dielectric structure layer 30, the organic layer 32, the dielectric structure layer 30, and the second inorganic layer 33 from bottom to top.

Please refer to FIG. 3, a manufacturing method of the organic light-emitting diode device 100 is also provided according to the embodiment of the present disclosure, and includes following steps S1-S3: S1, a step of providing the array substrate 1. S2, a step of disposing the light-emitting layer 2 on the substrate 1. S3, a step of disposing the thin-film encapsulation layer 3 on the light-emitting layer 2.

Figure 12:
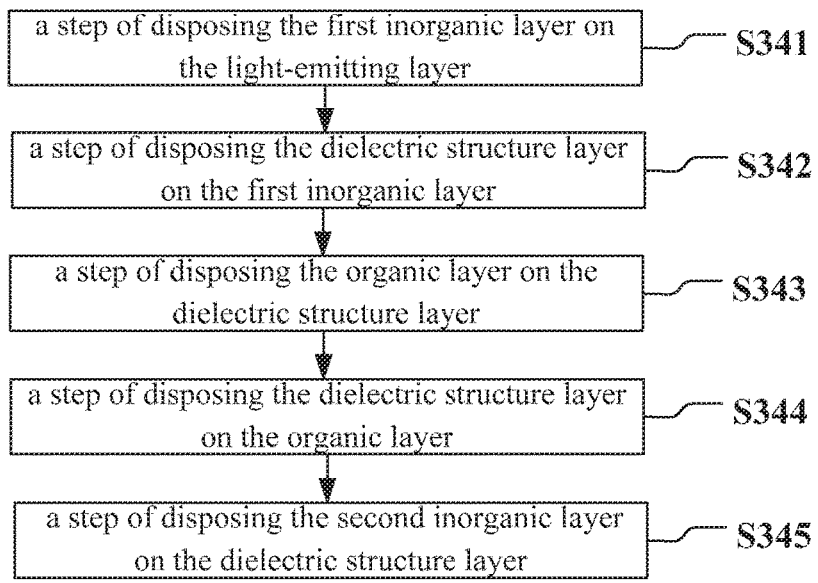
FIG. 12 is a schematic diagram of a manufacturing step of a thin-film encapsulation layer according to a fourth embodiment.

Please refer to FIG. 11 and FIG. 12 at the same time, the step S3 of disposing the thin-film encapsulation layer 3 on the light-emitting layer 2 includes following steps S341-S345:

S341, a step of disposing the first inorganic layer 31 on the light-emitting layer 2. The first inorganic layer 31 is made of a layer of inorganic material having a thickness of less than 2 um deposited on the light-emitting layer 2 by a chemical vapor deposition (CVD) or a physical vapor deposition (PVD). The inorganic material includes silicon nitride (SiN), silicon oxynitride (SiON), silicon carbonitride (SiNC), or silicon oxide (SiO).

S342, a step of disposing the dielectric structure layer 30 on the first inorganic layer 31.

S343, a step of disposing the organic layer 32 on the dielectric structure layer 30. The organic layer 32 is made of a layer of organic material deposited on the dielectric structure layer 30 by an inkjet printing (IJP), a chemical vapor deposition (CVD) or an evaporation. The organic material includes Hexamethyldisiloxane (HMDSO), alucone, epoxy resin, acrylic, or silicon-containing organic matter.

S344, a step of disposing the dielectric structure layer 30 on the organic layer 32.

S345, a step of disposing the second inorganic layer 33 on the dielectric structure layer 30. The second inorganic layer 33 is made of a layer of inorganic material having a thickness of less than 2 um deposited on the light-emitting layer 2 by a chemical vapor deposition (CVD) or a physical vapor deposition (PVD). The inorganic material includes silicon nitride (SiN), silicon oxynitride (SiON), silicon carbonitride (SiNC), or silicon oxide (SiO).

Defects of the organic layer 32 can be covered very well according to the embodiment, and the external water and oxygen blocking property of the thin-film encapsulation layer 3 can be further improved.

A Fifth Embodiment

Figure 13:
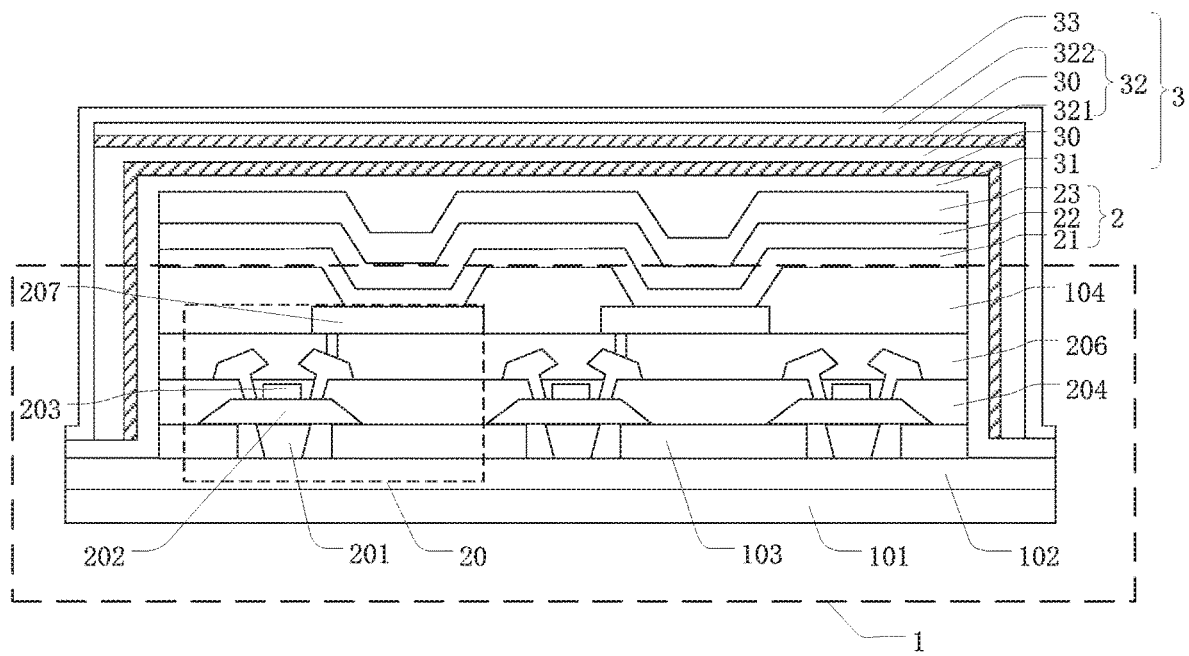
FIG. 13 is a schematic structural diagram of an organic light-emitting diode device according to a fifth embodiment.

Please refer to FIG. 13, the organic light-emitting diode device 100 including all technical features in the first embodiment and the third embodiment is provided according to the embodiment of the present disclosure. A difference is that that the fourth embodiment is a combination of the first embodiment and the third embodiment. That is, the dielectric structure layer 30 is disposed between the organic layer 32 and the first inorganic layer 31 and is disposed in the organic layer 32.

As shown in FIG. 13, the thin-film encapsulation layer 3 of the organic light-emitting diode device 100 includes the first inorganic layer 31, the dielectric structure layer 30, the organic layer 32, and the second inorganic layer 33 from bottom to top. The organic layer 32 includes the first organic layer 321 and the second organic layer 322, and the dielectric structure layer 30 is disposed between the first organic layer 321 and the second organic layer 322.

Please refer to FIG. 3, a manufacturing method of the organic light-emitting diode device 100 is also provided according to the embodiment of the present disclosure, and includes following steps S1-S3: S1, a step of providing the array substrate 1. S2, a step of disposing the light-emitting layer 2 on the substrate 1. S3, a step of disposing the thin-film encapsulation layer 3 on the light-emitting layer 2.

Please refer to FIG. 4, FIG. 9 and FIG. 13 at the same time, the step S3 of disposing the thin-film encapsulation layer 3 on the light-emitting layer 2, as shown in FIG. 4, includes following steps S311-S314: S311, a step of disposing the first inorganic layer 31 on the light-emitting layer S312, a step of disposing the dielectric structure layer 30 on the first inorganic layer 31. S313, a step of disposing the organic layer 32 on the dielectric structure layer 30. S314, a step of disposing a second inorganic layer 33 on the organic layer 32. According to the embodiment, please refer to FIG. 9, the step of disposing at least one dielectric structure layer 30 in the organic layer 32 includes: S3321, a step of disposing the first organic layer 321 on the first inorganic layer 31, a step of disposing the dielectric structure layer 30 on the first organic layer 321. S3323, a step of disposing the second organic layer 322 on the dielectric structure layer 30. Wherein the step S3322 of disposing the dielectric structure layer 30 on the first organic layer 321 and the step S3323 of disposing the second organic layer 322 are performed at least once.

Defects of the organic layer 32 can be covered very well according to the embodiment, and the external water and oxygen blocking property of the thin-film encapsulation layer 3 can be further improved.

A Sixth Embodiment

Figure 14:
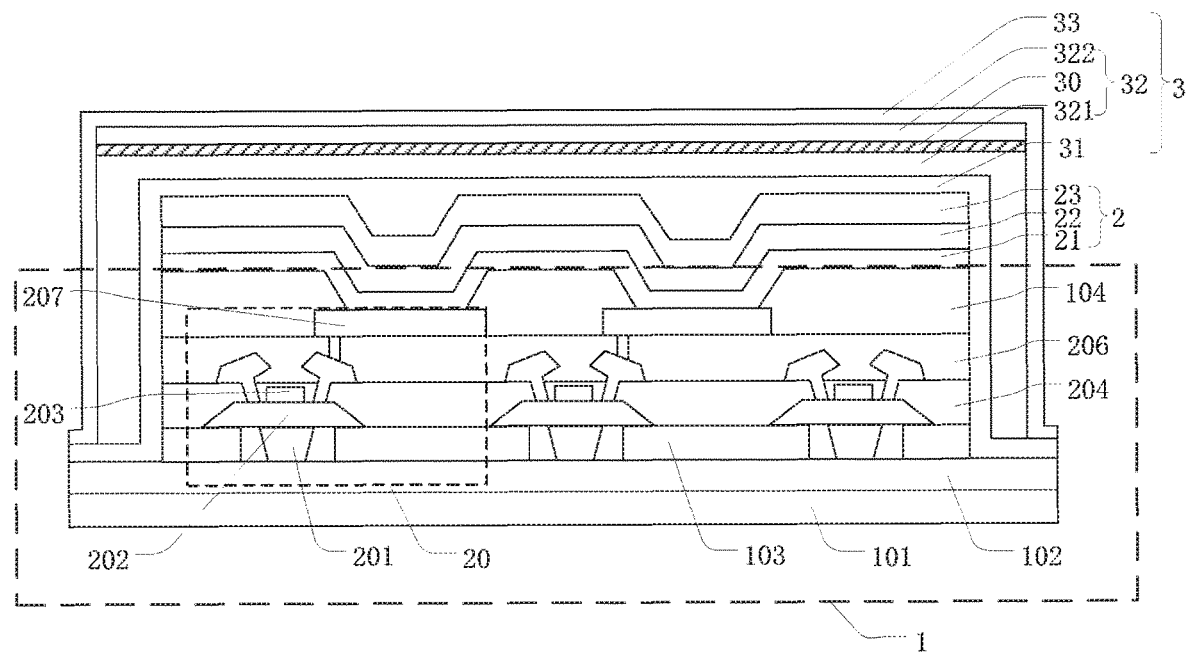
FIG. 14 is a schematic structural diagram of an organic light-emitting diode device according to a sixth embodiment.

Please refer to FIG. 14, the organic light-emitting diode device 100 including all technical features in the second embodiment and the third embodiment is provided according to the embodiment of the present disclosure. A difference is that that the sixth embodiment is a combination of the second embodiment and the third embodiment. That is, the dielectric structure layer 30 is disposed between the organic layer 32 and the second inorganic layer 33 and is disposed in the organic layer 32.

As shown in FIG. 14, the thin-film encapsulation layer 3 of the organic light-emitting diode device 100 includes the first inorganic layer 31, the organic layer 32, the dielectric structure layer 30, and the second inorganic layer 33 from bottom to top. The organic layer 32 includes the first organic layer 321 and the second organic layer 322, and the dielectric structure layer 30 is disposed between the first organic layer 321 and the second organic layer 322.

Please refer to FIG. 3, a manufacturing method of the organic light-emitting diode device 100 is also provided according to the embodiment of the present disclosure, and includes following steps S1-S3: S1, a step of providing the array substrate 1. S2, a step of disposing a light-emitting layer 2 on the substrate 1. S3, a step of disposing the thin-film encapsulation layer 3 on the light-emitting layer 2.

Please refer to FIG. 7, FIG. 9 and FIG. 14 at the same time, the step S3 of disposing the thin-film encapsulation layer 3 on the light-emitting layer 2 includes following steps S321-S324: S321, a step of disposing the first inorganic layer 31 on the light-emitting layer 2. S322, a step of disposing the organic layer 32 on the first inorganic layer 31. S323, a step of disposing the dielectric structure layer 30 on the organic layer 32. S324, a step of disposing the second inorganic layer 33 on the dielectric structure layer 30. Please refer to FIG. 9, the step of disposing the dielectric structure layer 30 on the organic layer 32 includes: S3321, a step of disposing the first organic layer 321 on the first inorganic layer 31. S3322, a step of disposing the dielectric structure layer 30 on the first organic layer 321. S3323, a step of disposing the second organic layer 322 on the dielectric structure layer 30. Wherein the step S3322 of disposing the dielectric structure layer 30 on the first organic layer 321 and the step S3323 of disposing the second organic layer 322 are performed at least once.

Defects of the organic layer 32 can be covered very well according to the embodiment, and the external water and oxygen blocking property of the thin-film encapsulation layer 3 can be further improved.

A Seventh Embodiment

Figure 15:
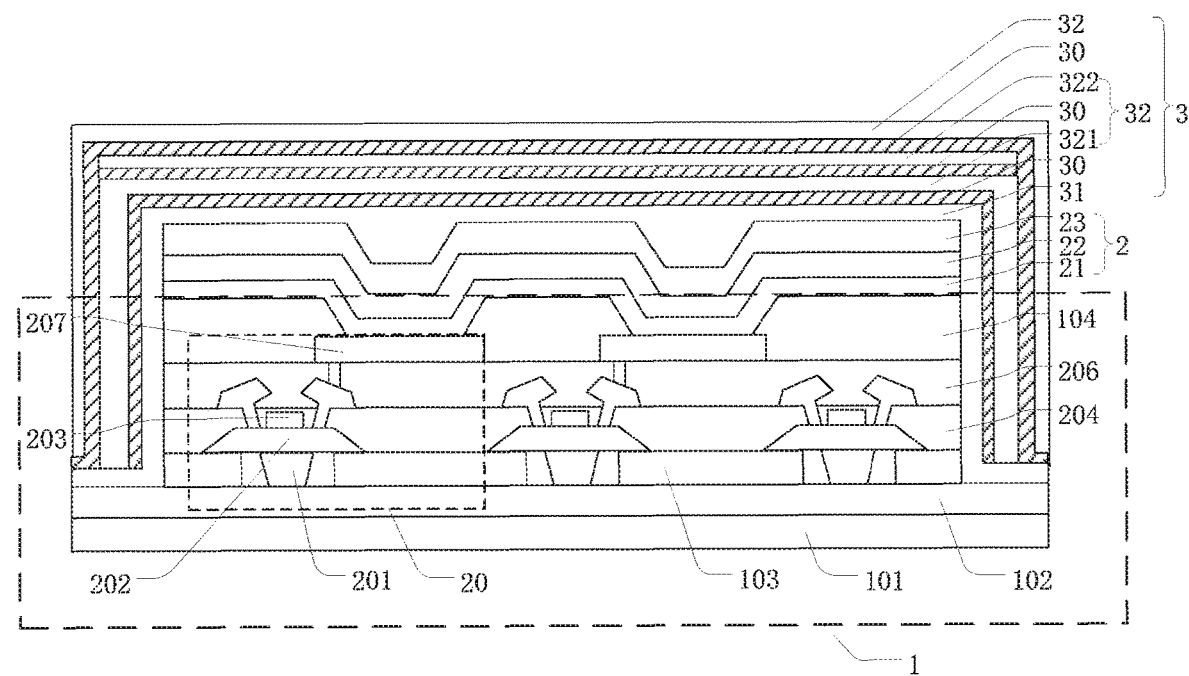
FIG. 15 is a schematic structural diagram of an organic light-emitting diode device according to a seventh embodiment.

Please refer to FIG. 15, the organic light-emitting diode device 100 including all technical features in the first embodiment, the second embodiment and the third embodiment is provided according to the embodiment of the present disclosure. A difference is that that seventh embodiment is a combination of the first embodiment, the second embodiment and the third embodiment. That is, the dielectric structure layer 30 is disposed between the organic layer 32 and the first inorganic layer 31, and the dielectric structure layer 30 is disposed between the organic layer 32 and the second inorganic layer 33, and the dielectric structure layer 30 is disposed in the organic layer 32.

As shown in FIG. 15, the thin-film encapsulation layer 3 of the organic light-emitting diode device 100 includes the first inorganic layer 31, the dielectric structure layer 30, the organic layer 32, the dielectric structure layer 30, and the second inorganic layer 33 from bottom to top. The organic layer 32 includes the first organic layer 321 and the second organic layer 322, and the dielectric structure layer 30 is disposed between the first organic layer 321 and the second organic layer 322.

Please refer to FIG. 3, a manufacturing method of the organic light-emitting diode device 100 is also provided according to the embodiment of the present disclosure, and includes following steps S1-S3: S1, a step of providing the array substrate 1. S2, a step of disposing the light-emitting layer 2 on the substrate 1. S3, a step of disposing the thin-film encapsulation layer 3 on the light-emitting layer 2.

Please refer to FIG. 9, FIG. 12 and FIG. 15 at the same time, the step S3 of disposing the thin-film encapsulation layer 3 on the light-emitting layer 2 includes following steps S341-S345: S341, a step of disposing the first inorganic layer 31 on the light-emitting layer 2. S342, a step of disposing the dielectric structure layer 30 on the first inorganic layer 31. S343, a step of disposing the organic layer 32 on the dielectric structure layer 30. S344, a step of disposing the dielectric structure layer 30 on the organic layer 32. S345, a step of disposing the second inorganic layer 33 on the dielectric structure layer 30. According to the embodiment, as shown in FIG. 9, the step of disposing the organic layer 32 on the dielectric structure layer 30 includes: S3321, a step of disposing the first organic layer 321 on the first inorganic layer 31, a step of disposing the dielectric structure layer 30 on the first organic layer 321. S3323, a step of disposing the second organic layer 322 on the dielectric structure layer 30. Wherein the step S3322 of disposing the dielectric structure layer 30 on the first organic layer 321 and the step S3323 of disposing the second organic layer 322 are performed at least once.

Defects of the organic layer 32 can be covered very well according to the embodiment, and the external water and oxygen blocking property of the thin-film encapsulation layer 3 can be further improved.

Advantages of the present disclosure is to provide the organic light-emitting diode device and a manufacturing method thereof. Defects of the organic layer can be covered very well, and the external water and oxygen blocking property of the thin-film encapsulation layer 3 can be further improved by depositing at least one very thin and dense dielectric structure layer in the thin-film encapsulation layer.

The present disclosure is described in detail in accordance with the above contents with the specific preferred examples. However, this present disclosure is not limited to the specific examples. For a person of ordinary skill in the art, on the premise of keeping the conception of the present disclosure, the technical personnel can also make simple deductions or replacements, all of which should be considered to belong to the protection scope of the present disclosure.

What is claimed is:

1. An organic light-emitting diode device, comprising:
an array substrate;
a light-emitting layer disposed on the array substrate; and
a thin-film encapsulation layer disposed on the light-emitting layer and completely covering the light-emitting layer, wherein the thin-film encapsulation layer comprises a first inorganic layer, an organic layer and a second inorganic layer that are stacked in sequence:
the first inorganic layer is disposed on the light-emitting layer;
the organic layer is disposed on the first inorganic layer; and
the second inorganic layer is disposed on the organic layer;
wherein the thin-film encapsulation layer comprises at least one dielectric structure layer, and the at least one dielectric structure layer is in direct contact with the first inorganic layer or the at least one dielectric structure layer is in direct contact with the second inorganic layer; and
wherein a material of the at least one dielectric structure layer is one or more of SiNC, and SiO in a stack combination;
wherein the at least one dielectric structure layer comprises three dielectric structure layers, one of which is disposed between the organic layer and the first inorganic layer, one of which is are disposed between the organic layer and the second inorganic layer, and the other one of which is disposed in the organic layer.

2. The organic light-emitting diode device as claimed in claim 1, wherein the at least one dielectric structure layer is disposed between the organic layer and the first inorganic layer;
or the at least one dielectric structure layer is disposed between the organic layer and the second inorganic layer.

3. The organic light-emitting diode device as claimed in claim 1, wherein the at least one dielectric structure layer is disposed between the organic layer and the first inorganic layer, or the at least one dielectric structure layer is disposed between the organic layer and the second inorganic layer.

4. The organic light-emitting diode device as claimed in claim 1, wherein the at least one dielectric structure layer comprises two dielectric structure layers, one of which is disposed between the organic layer and the first inorganic layer, and the other of which is disposed in the organic layer.

5. The organic light-emitting diode device as claimed in claim 1, wherein the at least one dielectric structure layer is manufactured by an atomic layer deposition method.

6. A manufacturing method of an organic light-emitting diode device, comprising steps of:
a step of providing an array substrate;
step of disposing a light-emitting layer on the array substrate, and
a step of disposing a thin-film encapsulation layer on the light-emitting layer;
wherein the step of disposing a thin-film encapsulation layer on the light-emitting layer comprises steps of:
a step of disposing a first inorganic layer on the light-emitting layer;
a step of disposing an organic layer on the first inorganic layer; and
a step of disposing a second inorganic layer on the organic layer;
wherein the step of disposing the thin-film encapsulation layer on the light-emitting layer further comprises:
a step of disposing at least one dielectric structure layer in direct contact with the first inorganic layer or in direct contact with the second inorganic layer in the thin-film encapsulation layer by an atomic layer deposition method, and a material of the at least one dielectric structure layer being one or more of SiNC, and SiO in a stack combination;
wherein forming the at least one dielectric structure layer comprises three dielectric structure layers, one of which is disposed between the organic layer and the first inorganic layer, one of which is are disposed between the organic layer and the second inorganic layer, and the other one of which is disposed in the organic layer.

7. The manufacturing method of an organic light-emitting diode device as claimed in claim 6, wherein the step of disposing the at least one dielectric structure layer in the thin-film encapsulation layer by the atomic layer deposition method comprises:
a step of disposing a first organic layer on the first inorganic layer;
a step of disposing the at least one dielectric structure layer on the first organic layer; and
a step of disposing the second organic layer on the at least one dielectric structure layer;
wherein the step of disposing the at least one dielectric structure layer on the first organic layer and the step of disposing the second organic layer on the at least one dielectric structure layer are performed at least once.

* * * * *